US005913105A

United States Patent [19]
McIntyre et al.

[11] Patent Number: 5,913,105
[45] Date of Patent: Jun. 15, 1999

[54] METHOD AND SYSTEM FOR RECOGNIZING SCRATCH PATTERNS ON SEMICONDUCTOR WAFERS

[76] Inventors: Michael McIntyre, 213 Sailors Run, Austin, Tex. 78734; Thinh Ngo, 1308 Thornberry Rd, #25, Del Valle, Tex. 78617

[21] Appl. No.: 08/564,905

[22] Filed: Nov. 29, 1995

[51] Int. Cl.$^6$ .................................................. H01L 21/66
[52] U.S. Cl. ...................... 438/16; 364/468.28; 29/25.02
[58] Field of Search .............................. 364/552, 571.02, 364/571.04, 468.28, 920.7, 921.8; 438/1.6, FOR 141, FOR 142; 29/25.02

[56] References Cited

U.S. PATENT DOCUMENTS

| | | |
|---|---|---|
| 3,751,647 | 8/1973 | Maeder et al. . |
| 4,579,455 | 4/1986 | Levy et al. . |
| 5,274,434 | 12/1993 | Morioka et al. . |
| 5,317,380 | 5/1994 | Allemand . |
| 5,325,443 | 6/1994 | Beatty et al. . |
| 5,464,779 | 11/1995 | Fujimaki . |

OTHER PUBLICATIONS

Bow, S., et al, "Detection of Tiny Scratches . . . Processing System", SPIE, vol. 1153, pp. 121–128, 1989.
Bow, S., et al, "Computerized Detection . . . Crystal Blanks", SPIE vol. 1396, pp. 646–655, 1990.
Brauner, R., et al, "Automated Chip Die Inspection", The International Journal For Hybrid Microelectronics, vol. 4, No. 2, pp. 111–114, Oct. 1981.
Baker, L., et al, "Semiconductor Wafer Inspection", SPIE, vol. 480, pp. 14–21, 1984.
Cohen, E.D., et al "Application of Digital Image Analysis. . . Development", J. of Imaging Science & Technology, 37(2) Mar.–Apr./1993, pp. 133–148.
Bow, S.T. "Detection of Tiny Scratches. . . Image Processing System", Proceedings of the SPIE —The Int'l Soc. for Optical Engineering, 1989 vol. 1153, pp. 121–128 (Abstract Only).
Bow, S.T. "Computerized Detection & Identification of. . . Blanks", Proceedings of the SPIE— The Int'l Soc. for Optical Engineering (1991) vol. 1396, pp. 646–655 (Abstract Only).

*Primary Examiner*—George Fourson

[57] ABSTRACT

Method and system for performing semiconductor manufacturing scratch recognition analysis in cooperation with wafer scanning tools is disclosed. The invention comprises a method for determining from scan data associated with defects or other points on a substrate, such as a semiconductor wafer, what defects comprise part of a scratch. The method comprises, for each cluster of defects, determining whether the cluster includes a minimum number of pixels, or defects. For each cluster comprising the minimum number of defects, determining the best fit line for the cluster, rotating the best fit line about its center of gravity to "fine tune" the fitness thereof, and then calculating the line attributes of the fine tuned best fit line to determine whether the cluster is a scratch and classifying the cluster accordingly.

19 Claims, 3 Drawing Sheets

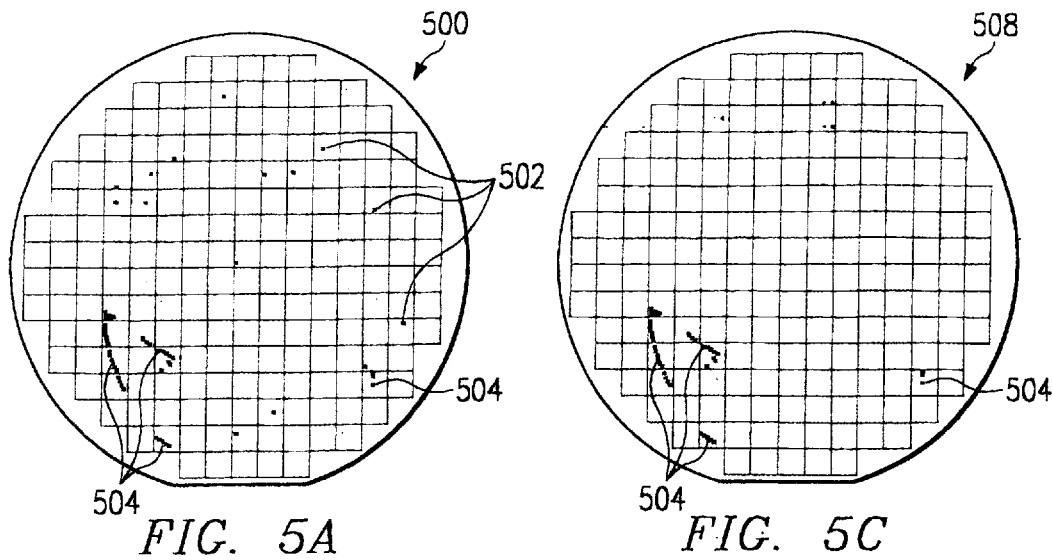
FIG. 5A
FIG. 5C
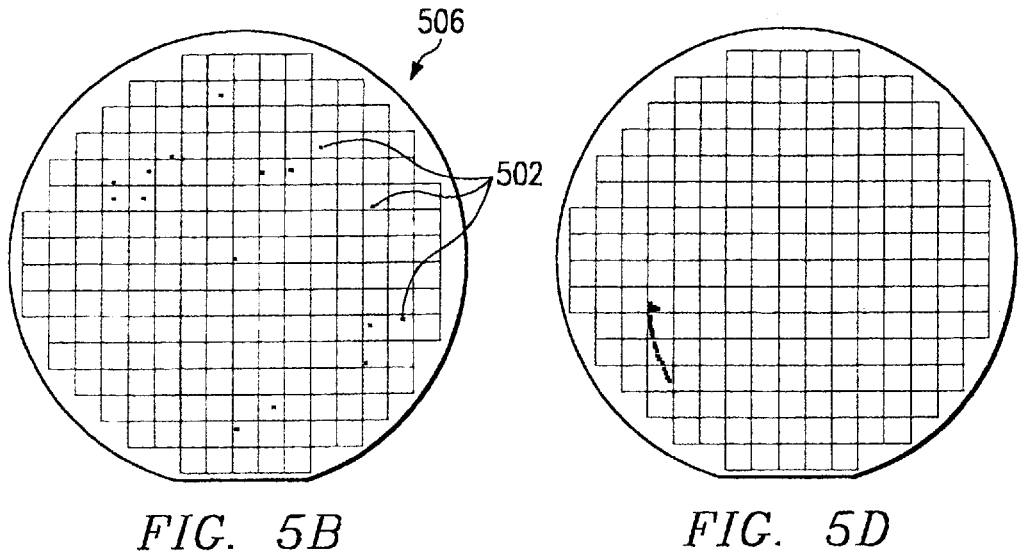
FIG. 5B
FIG. 5D
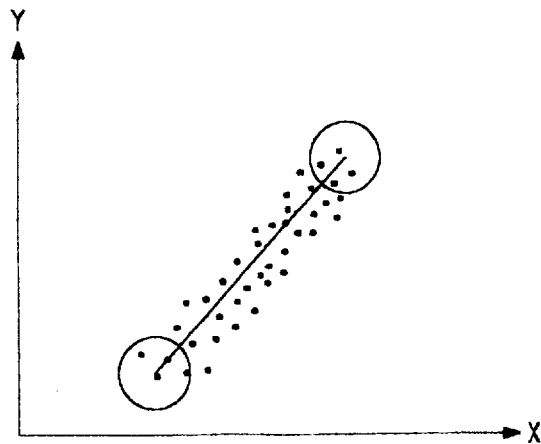
FIG. 6A
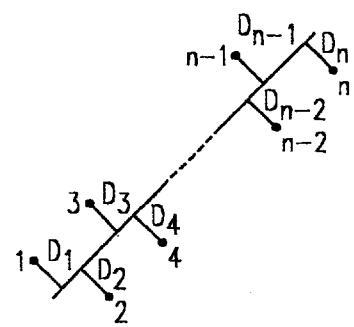
FIG. 6B

METHOD AND SYSTEM FOR RECOGNIZING SCRATCH PATTERNS ON SEMICONDUCTOR WAFERS

TECHNICAL FIELD

The invention relates generally to the manufacture of semiconductor integrated circuit ("IC") chips and, more particularly, to a method and system for automatically recognizing patterns in defect data indicating scratch-type defects on semiconductor wafers.

BACKGROUND OF THE INVENTION

The fabrication of semiconductor integrated circuits, or chips as they are commonly known, is an extremely complex process that involves several hundred or more operations. They are fabricated by selectively implanting impurities into, and applying conductive and insulative layers onto, a semiconductor substrate. Semiconductor chips are not manufactured individually, but rather as an assembly of a hundred or more chips on a "wafer," which is then diced up to produce the individual chips.

An ongoing problem in the manufacture of semiconductor chips has to do with yield. Because of various defects that can occur in fabrication of a wafer, significant numbers of wafer die have to be discarded for one reason or another, thereby decreasing the percentage yield per wafer and driving up the cost of individual chips. Defects are typically caused by foreign particles, minute scratches and other imperfections introduced during photoresist, photomask and diffusion operations. Yield impacts the number of wafer starts at the inception of production needed to meet specific customer order quantities for finished chips at the end of the production line. With the high demand for semiconductor chips and more orders than can possibly be filled by a fabrication facility, predicting yield to accurately gauge wafer starts, and utilizing defect data to remove yield detracting operations, are important aspects of improving the efficiency, and hence output, of the fabrication facility.

Wafer scanning tools are utilized to identify deflects that occur in the chip manufacturing process for the aforementioned purposes. Typically, such tools are located at a variety of positions along the production line and comprise automated-vision inspection stations for identifying visual irregularities in the wafer die as they move through the line. The irregularities, i.e., defects, are recorded according to their coordinates, estimate of size or other parameters and are stored as records in a database. The records represent raw information that must then be analyzed or otherwise processed off line to determine the impact, if any, of the identified defects on product yield. Some defects, for example, do not adversely affect yield as much as others, and therefore must be classified differently for analysis purposes.

Commercially available wafer scanning tools include those made by KLA Instruments Corporation of Santa Clara, Calif., Tencor Instruments Corporation of Mountain View, Calif., Inspex, Inc. of Billerica, Mass. and numerous other manufacturers. Despite significant advances made in wafer scanning technology, the various tools that are available suffer striking deficiencies. In particular, such tools lack the capability to perform advanced classification and analysis of defect information necessary to accurately determine the true impact of wafer defects on yield. While conventional tools offer simple data presentation capabilities, such as the display of wafer maps, histograms and charts, they do not adequately classify or process the defect data. Classification codes must typically be manually entered into wafer scan records indicating the type of defect and its potential impact on yield. This is done by placing the wafer on a review station where a user makes a judgment as to what the defect identified by the scan toot is, enters a classification code in the record for that defect, then proceeds to the next defect.

More sophisticated tools perform limited automatic classification of defect records according to the location of the defect on the wafer, in an effort to remove consideration of defects that do not require any classification. For example, it is recognized that a number of defect points in close proximity to one another, collectively referred to as a "cluster," can indicate a single event such as a contaminant or scratch present across one or more die. In this day and age of increased automation and reduction of manual operations and procedures in semiconductor processing, scratches continue to be a concern as a source of die loss in processing. This form of die loss is of special interest because scratches are considered an "avoidable" defect; however, the recognition of a scratch problem and the subsequent tracking down of the cause of such a problem can be anything but simple.

Scratches are caused by mechanical contact on the wafer's surface during processing. Such defects are caused by either a misalignment of a robotics handling system or sloppy and/or careless handling by manufacturing personnel. Defect detection tools can reveal scratch "patterns" on wafers when the full wafer map is displayed. Obviously, manual identification of scratches using defect maps is a fairly uncomplicated process; however, when one considers that hundreds of wafers per inspection tool are scanned per day, it is apparent that the time required to review each map individually to determine whether scratches are present can be an overwhelming task.

Consequently, there is a need for a method and system that permits more accurate defect analysis to be performed in cooperation with semiconductor wafer scanning tools and, particularly, a method and system that automatically recognizes scratch patterns on scanned semiconductor wafers.

SUMMARY OF THE INVENTION

The present invention, accordingly, provides a method and a system for performing semiconductor manufacturing defect analysis in cooperation with wafer scanning tools that overcome or reduce disadvantages and limitations associated with prior methods and systems, particularly with respect to automatic recognition of scratch-type defects on wafers.

One aspect of the invention is a method for determining from scan data associated with defects or other points on a substrate, such as a semiconductor wafer, what defects comprise part of a scratch. The method comprises, for each cluster of defects, determining whether the cluster includes a minimum number of pixels, or defects. For each cluster comprising the minimum number of defects, determining the best fit line for the cluster, rotating the best fit line about its center of gravity to "fine tune" the fitness thereof, and then calculating the line attributes of the fine tuned best fit line to determine whether the cluster is a scratch and classifying the cluster accordingly.

In a preferred embodiment the invention is implemented as a computer program stored on a computer-readable medium. The program is run on a system compatible with a commercially available wafer scanning tool or on the scanning tool itself.

A technical advantage achieved with the invention is that it automatically and more accurately recognizes scratch-type defects on semiconductor wafers from defect data.

Another technical advantage achieved with the invention is that the scratch data can be incorporated into standard control charts, from which the data can be tracked and included in a pareto.

Another technical advantage achieved with the invention is that losses due to scratches can be more effectively quantified and the causes thereof better addressed.

BRIEF DESCRIPTION OF THE DRAWINGS

FIGS. 5A–5D are schematic diagrams illustating, respectively, a raw data wafer map, a random defect wafer map, a cluster defect wafer map and a scratch defect wafer map each for representing defects contained on a wafer substrate.

FIGS. 6A and 6B illustrate particular aspects of the scratch recognition technique of the present invention.

DESCRIPTION OF THE PREFERRED EMBODIMENTS

Figure 1:
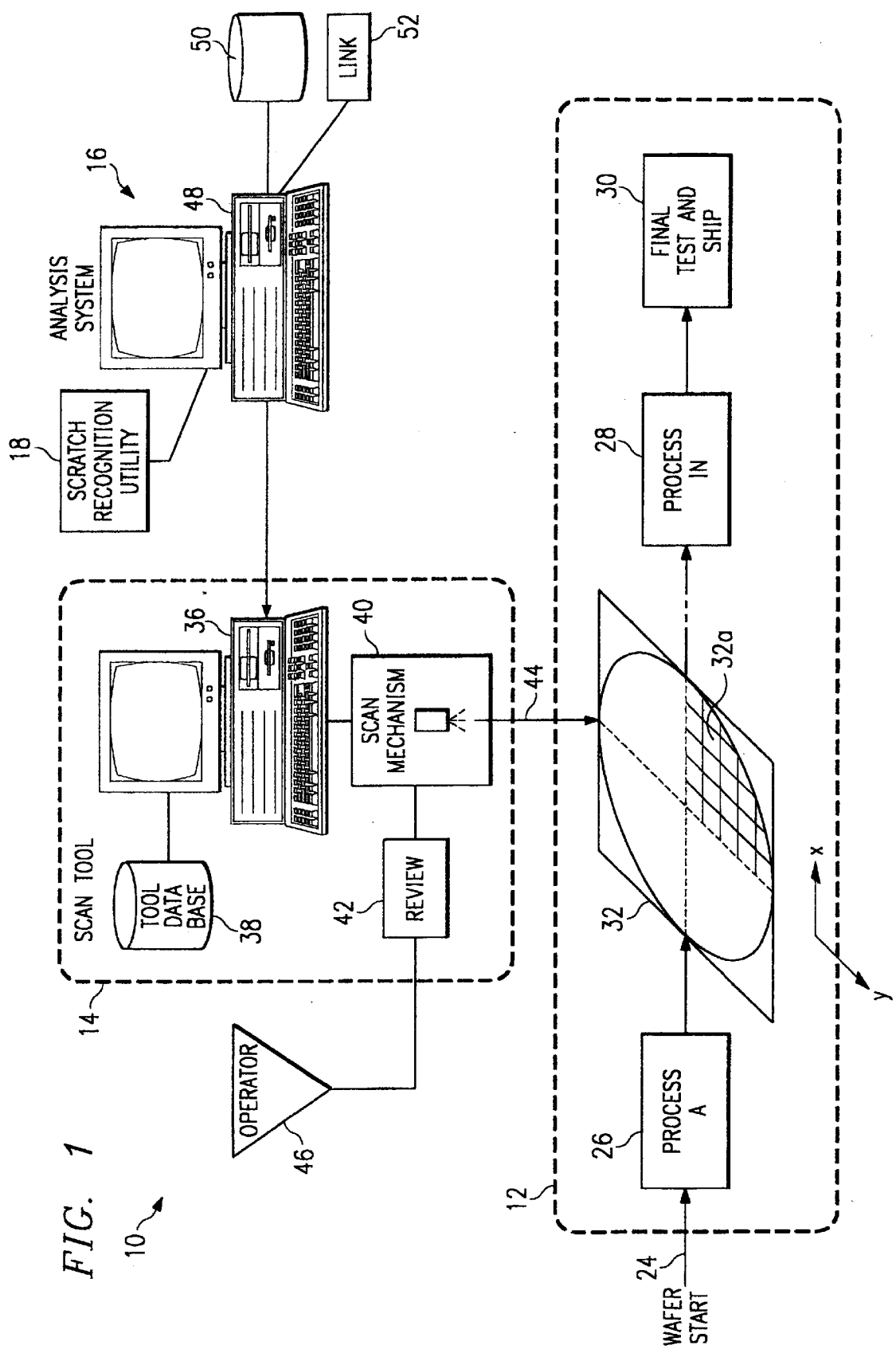
FIG. 1 is a schematic block diagram of a defect analysis system of the present invention for use with a wafer scanning tool in a semiconductor fabrication line.

In FIG. 1, the reference numeral 10 refers to an environment that is a portion of a semiconductor wafer fabrication facility ("wafer fab") for practicing the preferred embodiment of the invention. The environment 10 includes a manufacturing line 12 for fabricating semiconductor integrated circuit (IC) products, a scan tool 14 for visually inspecting wafers comprising the ICs at various stages of fabrication, and a defect analysis system 16 operatively coupled to the tool 14 for performing defect data decluster and scratch recognition operations of the preferred embodiment, as discussed more fully below.

Operatively coupled to the system 16 is a computer program scratch recognition utility 18 that performs the defect data decluster and scratch recognition functions of the preferred embodiment, described fully below.

In the environment 10, semiconductor wafers are started in the manufacturing process, as indicated at line 24. The wafers are grouped and started in multiples, referred to as "lots", upon which a sequence of individual process operations are then performed. Process step A is first performed on a wafer lot as indicated by block 26. Subsequently, additional process steps are performed. Each process step, for example, comprises operations to be performed for a particular mask or layer of the wafers in the lot. Since the process steps are conventional and vary depending on the integrated circuit (IC) product being manufactured, they are not described in further detail. Block 28 represents completion of a sequence of many (up to N) processes, it being understood that in the typical wafer fab over one thousand processes, averaging up to a hundred or more steps each, must be completed. Upon completion, at block 30 the ICs comprising the wafers are ready for final test and shipment.

Following completion of Process A in block 26, the wafer scan tool 14 is used to perform a visual inspection of at least representative samples of the partially fabricated ICs in the wafer lot, as is represented by a wafer 32 located in proximity to the tool 14. While not shown, it is understood that similar inspections are performed at various stages of manufacturing of the wafer 32 and numerous tools 14 may be required to perform the inspections. Generally, the visual inspection performed by the scan tool 14 is used to identify defects of particular types to be used in an analysis of the effect of each defect type on the yield of the lot, or on the yield of individual wafers or wafer die in the lot. Engineering analysis of the process steps associated with particular defects may then be performed to identify and correct yield detracting operations.

The scan tool 14 comprises commercially available components and includes a computer 36, a database 38, a scan mechanism 40 and a review station 42. In a preferred embodiment, for example, the tool 14 is a KLA 21(xx) series defect scanning tool available from KLA Instruments Corporation. The scan mechanism 40 includes a microscope or other device for inspecting particles or other defects on the surface of the wafer 32. The wafer 32 may be moved relative to scan mechanism 40 by a transport mechanism (not shown) in the x and y directions perpendicular to the scan mechanism 40 to cause the microscope to sweep over the surface of the wafer in a series of adjacent, possibly overlapping, scan lines. Each wafer die, such as a die 32a, is scanned and the information derived therefrom is converted to digital form and processed by the computer 36. In operation the scan mechanism 40 compares one die of the wafer 32 to the next. Presumably, every die will be identical to the next and any differences indicate an error, i.e., a defect. As will be described further with reference to FIG. 2, the computer 36 constructs files comprising records of scanned defects that are then stored in the database 38. Each record includes defect data concerning the x-location and y-location of the defect, and an estimation of the x-size and y-size of the defect on the wafer. Other fields of the records include, but are not necessarily limited to, classification codes for the defects.

The review station 42 is used by an operator 46 to manually study defects scanned by the mechanism 40. In a typical conventional application, the operator 46 must study the defects and either enter or modify classification codes into the stored records for the defects on the computer 36.

The tool 14 is capable of generating on its display various graphics indicative of scanned defects. These include histograms, wafer maps, charts or the like. The tool 14 is further capable of assembling files of defect records stored in the database 38 which may then be used to various perform defect analyses. As explained in detail below, the scratch recognition utility 18 is utilized in cooperation with the tool 14 to modify defect records in improvement of subsequent analyses.

The defect analysis system 16 includes a computer 48, a system database 50 and a link 52. The link 52 operatively connects the system 16 to other control systems or computers (not shown) within the fab. In the preferred embodiment, the computer 48 is a commercially available PC or workstation running a Microsoft Windows operating system. Preferably, the system 16 is designed to read defect and sort files in the KLA Results File format, available from KLA instruments Corporation, and also the TLV format, available from Inspex, Inc. The utility 18 is stored in the system 16 as one or more programs for operation on the computer 48 and is preferably written in C++ programming language.

Figure 2:
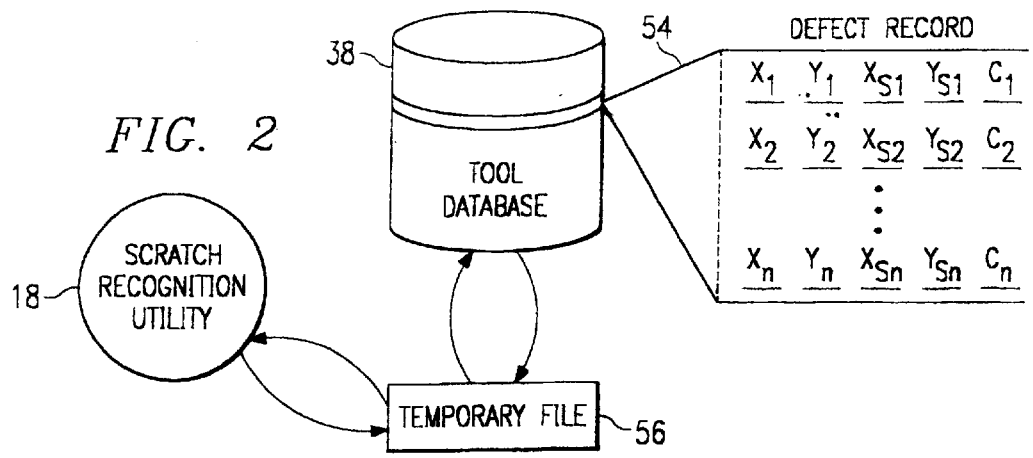
FIG. 2 is a conceptual block diagram of the sequence of operations performed on the defect data by the system of FIG. 1.

FIG. 2 illustrates a general process flow of the sequence of functions performed on defect data in the preferred embodiment of the invention. Referring to both FIGS. 1 and 2, the database 38 of the scan tool 14 is used to store wafer defect data in the form of "records." Shown schematically in FIG. 2 is the data structure of one such record 54 that contains data pertaining to the defects detected on the wafer 32. While not shown, it is understood that multiple records are stored in the database 38, each relating to wafer defects at different reticle layers of wafers in one or more lots. It is appreciated the records are organized into computer files by the computer 36 according to lot, layer and wafer designations, for example.

The record 54 comprises information concerning all of the defects (1 through n) detected on the wafer 32, including the x-location (x) and y-location (y) of each defect, and an estimation of the size of the defect in the x ($x_s$) and y ($y_s$) directions. Another field of the record 54 contains a classification code for the defect. The classification code indicates the nature of the defect and can be used to evaluate whether a defect is critical, i.e., whether it impacts the functionality of the IC. For example, a defect might be classified in terms of whether the defect is one that cuts a circuit line, or touches two lines, or whether it is above a particular layer or beneath a particular layer. The classification codes also might classify defects in terms of defect size, i.e., whether it is part of a big cluster or small cluster, or in terms of whether the defect is "discardable" in that it does not represent additional meaningful information for the defect analysis. It should be noted that all defects in a cluster, including those comprising a scratch, are presumed to have been caused by the same mechanism and therefore have the same classification code. Other criteria for classification codes are readily understood by those skilled in the art and therefore are not discussed further.

The classification codes for defects in the record 54 are used to make estimates concerning what impact, if any, a particular defect type will have on die or wafer yield. Once the wafer 32 is scanned and the defects are identified in the record 54 in terms of their location data (x, y) and size data ($x_s$, $y_s$), the normal procedure is then for an operator 46 to review the defects and manually enter the classification codes for each defect into the record 54. This is done by placing the wafer 32 on the review station 42 that includes a microscope (not shown) designed to automatically locate itself to the sites of the defects. The operator 46, based upon judgments about what the defect is, can classify it and then modify the record 54 to include the appropriate classification code.

Wafers can include hundreds of thousands of defects and it is a very time consuming task to manually enter classification codes for each of them in the record 54; typically, only a small percentage of scanned wafers and lots get manual review. Therefore, before manual review and classification of defects is performed by the operator 46, the scratch recognition utility 18 operates to automatically recognize and make note of scratch-type defects in the record 54.

From the database 38, the computer 36 writes out a temporary file 56 that contains the records for a particular lot, such as a lot containing the wafer 32 and its corresponding record 54. The temporary file 56 is stored in the computer 48 of the analysis system 16. The scratch recognition utility 18, running on the computer 48, reads the file 56 and, as explained below, declusters the defect data and then identifies defect data comprising scratches and enters classification codes into the record 54 to indicate same. With the classification codes thus filled in by the utility 18, the modified file 56 is returned to the tool database 38. Typically, the modified file 56 is returned to a different file directory of the tool 14 and then converted to appropriate entries in the database 38.

Accordingly, once the utility 18 has identified scratches in the defect data, the operator 46 can then perform a subsequent manual review of the wafer to further classify defects by concentrating on a much smaller number of them.

Figure 3:
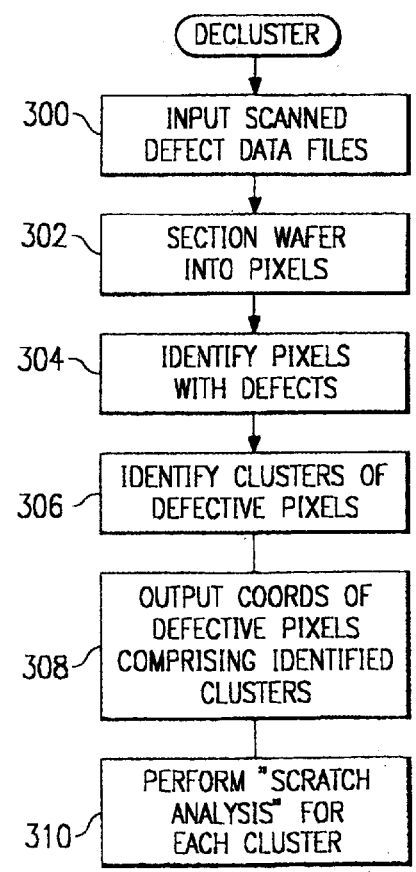
FIGS. 3 and 4 illustrate process control flow diagrams of the scratch recognition utility of the system of FIG. 1.

FIG. 3 is a flowchart illustrating a declustering routine of the present invention. In step 300, a defect data record from the database 38 is input to the system 16. In step 302, the wafer is sectioned into pixels. As used herein, a "pixel" designates the smallest resolvable point on a scan. In step 304, pixels with defects are identified. FIG. 5A illustrates a raw data wafer map 500 wherein each defective pixel is identified with a black dot. It will be recognized that the wafer represented by the wafer map 500 contains several "random" defects, such as the defects 502, as well as "clusters" of defects 504. As used herein, a "cluster" is any group of pixels comprising a predetermined number of pixels within an area of predetermined size. In step 306, clusters of defects are identified, thereby enabling the generation of a random defects wafer map 506, as shown in FIG. 5B, showing only those defects identified as being random, and a cluster defects wafer map 508, as shown in FIG. 5C, showing only those defects identified as being clusters. In step 308, the coordinates of the defective pixels of each cluster are output to a file. Finally, in step 310, a "scratch analysis" routine (FIG. 4) is performed for each cluster 504.

Figure 4:
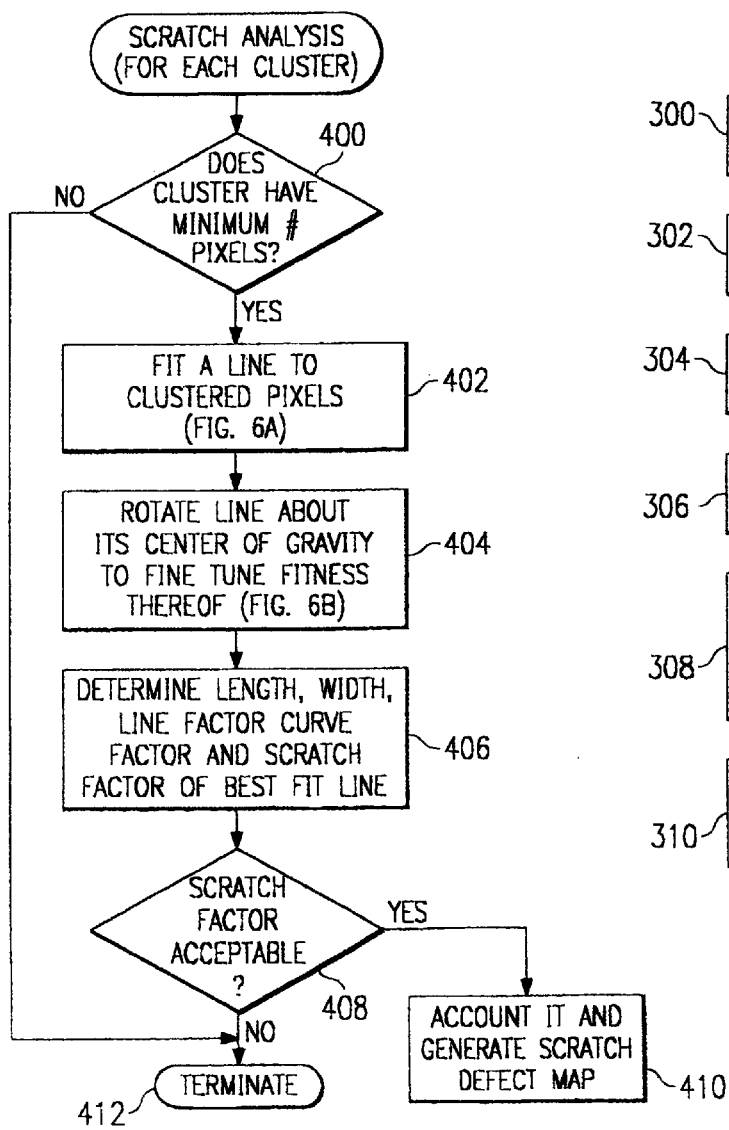

Referring now to FIG. 4, the scratch analysis routine of the present invention will be described. In step 400, a determination is made whether the current cluster comprises a minimum number of pixels. This is a filtering step designed to filter out clusters that could not possibly be scratches because of their size and to filter out clusters that may be scratches but that are insignificant because of their size. If in step 400 it is determined that the cluster comprises a minimum number of pixels, execution proceeds to step 402.

In step 402, a line is fitted to the clustered pixels. Specifically, as illustrated in FIG. 6A, this is accomplished by selecting ten percent of the top and bottom pixels by sorting their (x, y) coordinates then averaging the top and bottom pixels into two averaged top and bottom pixels. Finally, a line is drawn through the two averaged top and bottom pixels wherein:

$$y=ax+b$$

Referring again to FIG. 4, in step 404, the line drawn in step 402 is rotated about its center of gravity to "fine tune" the fitness thereof. Specifically, this step is accomplished by calculating the distance $D_n$ of each pixel n from the line, as illustrated in FIG. 6B. Next, a "fitness number," defined as the sum of the squares of the distances $D_n$, is calculated. The center of gravity of the line is determined using the following equations:

$$x_g = \sum_{i=1}^{n} \frac{d_i}{n}$$

$$y_g = ax_g + b$$

Once the coordinates ($x_g$, $y_g$) have been determined, the line is rotated about that point ninety degrees (90°) in both directions in increments of 10 degrees and the fitness number is recalculated at each point. The line with the smallest fitness number is selected as the best fit line.

Referring again to FIG. 4, in step 406, the line attributes of the best fit line selected in step 404 are calculated.

Specifically, the length (L), width (W), line factor (LF) curve factor (CF) and scratch factor (SF) are calculated. L is defined as the distance between the two end points ((x1, y1), (x2, y2)) of the line and is calculated using the following equation:

$$L = sqrt((y_2-y_1)^2 + (x_2-x_1)^2)$$

W represents the average number of pixels along the line and is defined as the number of pixels in the cluster divided by L. LF is the ratio of line length to line width and is equal to W divided by L.

CF is a measure of the curvature of the line and is calculated as follows. First, the fitness number of the best fit line (ftn) is calculated as described above. Next, the fitness number of the line perpendicular to the best fit line and going through the center of gravity thereof ($ftn_p$) is calculated. CF is then determined using the following equation:

$$CF = ftn/ftn_p$$

CF will be equal to 0 if the line is straight, 1 if the line is a circle, such that the higher the CF, the more curved the line. It should be noted that scratches caused by human handling are slightly arced as one wafer hits another wafer surface; whereas scratches caused by mechanical (robotic) handling vary in nature.

SF is a function of L, W, LF and CF and is calculated as follows. First, for a cluster to be considered a scratch, its W must be less than 1.2 pixels. If so, SF is calculated using the following equation:

$$SF = wl*ln*LF + wc*cn*CF$$

where wl is the weight given LF, wc is the weight given CF, and ln and cn are normalization factors. In the preferred embodiment, w1 is equal to 2, wc is equal to 1, and cn and ln are equal to 3.3.

Referring again to FIG. 4, in step 408, a determination is made whether the SF calculated in step 406 is within acceptable limits, i.e., is a scratch. In the preferred embodiment, if SF is less than or equal to 1, the cluster is considered a scratch; otherwise, i.e., if SF is greater than 1, the cluster is not a scratch. If in step 408 it is determined that the cluster is a scratch, execution proceeds to step 410, in which the defect is accounted for and a scratch defect map, as shown in FIG. 5D, is generated in a known manner. In particular, a scratch defect is accounted during a scratch statistics update, which occurs after scratch recognition. Scratch statistics could include percentage and total of scanned wafers, scanned lots, and scanned dice, with scratches and scratch density. Each of these statistics can be trended over time. If in step 408, SF is not within acceptable limits, i.e., the cluster is not a scratch, execution terminates in step 412. Similarly, if in step 400 the cluster does not have a minimum number of pixels, execution proceeds directly to step 412.

In this manner, scratch-type defects occurring on semiconductor wafers can be automatically and accurately recognized form defect data.

It is understood that the present invention can take many forms and embodiments. The embodiments shown herein are intended to illustrate rather than to limit the invention, it being appreciated that variations may be made without departing from the spirit of the scope of the invention. For example, the utility 18 may comprise one or more computer programs operable on either the system 16 or on the tool 14, such that a computer separate from the scan tool may not necessarily be required. Substrates other than wafers may be examined. The utility may be implemented in any appropriate programming language and run in cooperation with any computer system or scan tool.

Although illustrative embodiments of the invention have been shown and described, a wide range of modification, change and substitution is intended in the foregoing disclosure and in some instances some features of the present invention may be employed without a corresponding use of the other features. Accordingly, it is appropriate that the appended claims be construed broadly and in a manner consistent with the scope of the invention.

What is claimed is:

1. A method of detecting scratches on a substrate from data associated with defective points on said substrate, the method comprising:

declustering said data into a plurality of clusters;

for each of said clusters, determining whether said cluster comprises a minimum number of defective points;

for each cluster comprising said minimum number of defective points, determining a best fit line for said cluster, calculating line attributes of said best fit line and using said calculated line attributes to determine whether said cluster is a scratch.

2. The method of claim 1 wherein determining a best fit line further comprises:

determining an initial best fit line:

determining a center of gravity for said cluster:

rotating the initial best fit line about the center of gravity to determine candidate best fit lines; and selecting the best fit line from the candidate best fit lines.

3. The method of claim 2 wherein said fine tuning comprises determining a center of gravity of said cluster and rotating said best fit line about said center of gravity.

4. The method of claim 1 wherein said line attributes comprise a length, width, line factor and curve factor of said best fit line.

5. The method of claim 4 further comprising calculating a scratch factor from said length, width, line factor and curve factor.

6. The method of claim 5 wherein when said scratch factor is less than or equal to 1, said cluster is a scratch.

7. A method of detecting scratches on a substrate from data associated with defective points on said substrate, the method comprising:

declustering said data into a plurality of clusters;

for each of said clusters, determining whether said cluster comprises a minimum number of defective points;

for each cluster comprising said minimum number of defective points:

determining a best fit line for said cluster;

calculating line attributes of said best fit line;

comparing said calculated line attributes to standard line attributes to determine whether said cluster is a scratch; and classifying said cluster as a scratch or a nonscratch; and generating a defect map showing said clusters classified as scratches.

8. The method of claim 7 wherein determining a best fit line further comprises:

determining an initial best fit line;

determining a center of gravity for said cluster;

rotating the initial best fit line about the center of gravity to determine candidate best fit lines; and selecting the best fit line from the candidate best fit lines.

9. The method of claim 7 wherein said line attributes comprise a length, width, line factor and curve factor of said best fit line.

10. The method of claim 9 further comprising calculating a scratch factor from said length, width, line factor and curve factor.

11. The method of claim 10 wherein when said scratch factor is less than or equal to 1, said cluster is a scratch.

12. A computer program product for detecting scratches on a substrate from data associated with defective points on said substrate, the program stored on computer readable media and comprising:

instructions for declustering said data into a plurality of clusters;

instructions for determining, for each of said clusters, whether said cluster comprises a minimum number of defective points;

instructions for determining a best fit line for each of said clusters comprising a minimum number of defective points;

instructions for determining from said calculated line attributes whether each of said clusters comprising a minimum number of defective points is a scratch.

13. The computer program product of claim 12 wherein said line attributes comprise a length, width, line factor and curve factor of said best fit line.

14. The computer program product of claim 13 further comprising instructions for calculating a scratch factor from said length, width, line factor and curve factor.

15. The computer program product of claim 14 wherein when said scratch factor is less than or equal to 1, said cluster is a scratch.

16. Apparatus for detecting scratches on a substrate from data associated with defective points on said substrate, the program stored on computer readable media and comprising:

means for declustering said data into a plurality of clusters;

means for determining, for each of said clusters, whether said cluster comprises a minimum number of defective points;

means for determining a best fit line for each of said clusters comprising a minimum number of defective points;

means for calculating line attributes of said best fit line for each of said clusters comprising a minimum number of defective points;

means for determining from said calculated line attributes whether each of said clusters comprising a minimum number of defective points is a scratch.

17. The apparatus of claim 16 wherein said line attributes comprise a length, width, line factor and curve factor of said best fit line.

18. The apparatus of claim 16 farther comprising means for calculating a scratch factor from said length, width, line factor and curve factor.

19. The apparatus of claim 18, wherein when said scratch factor is less than or equal to 1, said cluster is a scratch.

* * * * *

UNITED STATES PATENT AND TRADEMARK OFFICE
CERTIFICATE OF CORRECTION

PATENT NO.    : 5,913,105
DATED         : June 15, 1999
INVENTOR(S)   : McIntyre et al.

It is certified that error appears in the above-identified patent and that said Letters Patent is hereby corrected as shown below:

Please add as Assignee:

Advanced Micro Devices, Inc.

Sunnyvale, CA

In the claims:
Column 10,
Line 24: "farther" should read --further--.

Signed and Sealed this

Third Day of July, 2001

Attest:

NICHOLAS P. GODICI
*Attesting Officer*    *Acting Director of the United States Patent and Trademark Office*